(12) United States Patent
Zhao et al.

(10) Patent No.: US 12,210,288 B2
(45) Date of Patent: Jan. 28, 2025

(54) PHOTORESIST REMOVAL METHOD AND PHOTORESIST REMOVAL SYSTEM

(71) Applicant: Tencent Technology (Shenzhen) Company Limited, Shenzhen (CN)

(72) Inventors: Zhongping Zhao, Shenzhen (CN); Wenlong Zhang, Shenzhen (CN); Maochun Dai, Shenzhen (CN); Sainan Huai, Shenzhen (CN); Yu Zhou, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 198 days.

(21) Appl. No.: 17/576,774

(22) Filed: Jan. 14, 2022

(65) Prior Publication Data

US 2022/0317573 A1 Oct. 6, 2022

Related U.S. Application Data

(63) Continuation of application No. PCT/CN2021/117270, filed on Sep. 8, 2021.

(30) Foreign Application Priority Data

Mar. 30, 2021 (CN) .......................... 202110340148.X

(51) Int. Cl.
*H01L 21/67* (2006.01)
*G03F 7/42* (2006.01)
(Continued)

(52) U.S. Cl.
CPC .............. *G03F 7/422* (2013.01); *G03F 7/428* (2013.01); *H01L 21/02052* (2013.01);
(Continued)

(58) Field of Classification Search
CPC ..... G03F 7/00–70991; H01L 21/00–86; H01L 23/4821; B08B 3/00–14
See application file for complete search history.

(56) References Cited

U.S. PATENT DOCUMENTS 5,024,961 A * 6/1991 Lee .................. H01L 21/76218
257/E21.558
5,308,440 A * 5/1994 Chino ................. H01L 23/5221
438/739

(Continued)

FOREIGN PATENT DOCUMENTS

| CN | 101276778 A | * 10/2008 |
| CN | 102193344 A | 9/2011 |

(Continued)

OTHER PUBLICATIONS

Remover PG Technical Data Sheet, Kayaku Advanced Materials, dated Nov. 2020 (archived by Wayback Machine on Jan. 27, 2021), available at https://web.archive.org/web/20210127044004/https://kayakuam.com/wp-content/uploads/2020/11/KAM-Remover-PG-TDS.10.29.20-final.pdf (Year: 2020).*

(Continued)

*Primary Examiner* — Mikhail Kornakov
*Assistant Examiner* — Richard Z. Zhang
(74) *Attorney, Agent, or Firm* — Morgan, Lewis & Bockius LLP

(57) ABSTRACT

This application relates to a photoresist removal method, including: acquiring a target wafer, a photoresist being provided on a surface of the target wafer, a surface of a photoresist layer of the photoresist being plated with a metal overhead layer; immersing the target wafer in a first organic solvent at a first temperature in a water bath for a first duration; rinsing the target wafer with a new first organic solvent in response to an end of the first duration; performing, in the first organic solvent, ultrasonic cleaning on the (Continued)

rinsed target wafer for a second duration based on a target ultrasonic power; removing the residual first organic solvent on the surface of the target wafer in response to an end of the second duration; and drying the target wafer with the solvent removed by simultaneous centrifugal drying and gas purging to obtain the target wafer with the photoresist removed.

11 Claims, 6 Drawing Sheets

(51) Int. Cl.
    *H01L 21/02*     (2006.01)
    *H01L 21/027*     (2006.01)

(52) U.S. Cl.
    CPC ......... *H01L 21/67057* (2013.01); *G03F 7/42* (2013.01); *H01L 21/0272* (2013.01); *H01L 21/67028* (2013.01); *H01L 21/6704* (2013.01); *H01L 21/67086* (2013.01)

(56) References Cited

U.S. PATENT DOCUMENTS

| | | | |
|---|---|---|---|
| 5,407,866 A * | 4/1995 | Sellers | H01L 23/5329 257/E21.59 |
| 5,476,818 A * | 12/1995 | Yanof | H01L 24/13 29/841 |
| 5,488,253 A * | 1/1996 | Matsuoka | H01L 23/5221 257/482 |
| 5,593,926 A * | 1/1997 | Fujihira | H01L 21/67023 438/464 |
| 5,858,106 A * | 1/1999 | Ohmi | B08B 3/12 134/28 |
| 6,027,602 A * | 2/2000 | Hung | H01L 21/67028 156/345.23 |
| 6,136,614 A * | 10/2000 | Funk | H01L 21/67294 438/5 |
| 6,286,524 B1 | 9/2001 | Okuchi et al. | |
| 2001/0033000 A1 * | 10/2001 | Mistry | H01L 29/7834 257/E29.267 |
| 2002/0007844 A1 * | 1/2002 | Orii | H01L 21/67023 134/99.1 |
| 2002/0162578 A1 * | 11/2002 | Ma | G03F 7/425 257/E21.228 |
| 2003/0067020 A1 * | 4/2003 | Itoh | H01L 29/41725 257/E29.116 |
| 2003/0080349 A1 * | 5/2003 | Quaglietta | H01L 29/73 257/E29.174 |
| 2006/0260642 A1 * | 11/2006 | Verhaverbeke | B08B 3/02 134/33 |
| 2009/0095320 A1 | 4/2009 | Wang et al. | |
| 2009/0225592 A1 * | 9/2009 | Lau | H01L 29/78684 365/170 |
| 2011/0023910 A1 * | 2/2011 | Dirschus | A47L 15/0047 134/18 |
| 2012/0017941 A1 * | 1/2012 | Preiss | B08B 9/20 134/18 |
| 2014/0377951 A1 | 12/2014 | Taddei et al. | |
| 2015/0090694 A1 | 4/2015 | Hashimoto et al. | |
| 2015/0137310 A1 * | 5/2015 | Fillmore | H01L 23/4821 438/619 |
| 2016/0230130 A1 * | 8/2016 | Schumann | C11D 1/75 |
| 2018/0313986 A1 | 11/2018 | Zhu et al. | |
| 2019/0029106 A1 * | 1/2019 | Lin | C25D 5/34 |
| 2019/0150702 A1 * | 5/2019 | Lukschnat | D06F 34/32 |
| 2020/0301284 A1 * | 9/2020 | Wang | G03F 7/426 |
| 2020/0360973 A1 * | 11/2020 | Joksch | B08B 9/0325 |
| 2021/0322610 A1 * | 10/2021 | Willocx | B08B 9/08 |
| 2022/0005748 A1 * | 1/2022 | Shimizu | H01L 21/76834 |

FOREIGN PATENT DOCUMENTS

| | | | |
|---|---|---|---|
| CN | 104155854 A | | 11/2014 |
| CN | 104252103 A | | 12/2014 |
| CN | 104752155 A | | 1/2015 |
| CN | 105251745 A | | 1/2016 |
| CN | 106547179 | † | 3/2017 |
| CN | 107665810 A | | 6/2018 |
| CN | 109860087 A | * | 6/2019 |
| CN | 110510574 | * | 11/2019 |
| CN | 111103770 A | | 5/2020 |
| CN | 112146359 A | | 12/2020 |
| CN | 112420545 A | | 2/2021 |
| DE | 3937442 A1 | * | 5/1991 |
| JP | H 02130553 A | | 5/1990 |
| JP | H 1027771 A | | 1/1998 |
| JP | 2003088789 A | | 3/2003 |
| JP | 2005191587 A | | 7/2005 |
| JP | 2008244276 A | | 10/2008 |
| JP | 2013211377 A | | 10/2013 |
| JP | 2019207948 A | | 12/2019 |
| KR | 19980010639 U | | 4/1998 |
| KR | 20090063845 A | * | 6/2009 |
| WO | WO2020202600 A1 | * | 10/2020 |

OTHER PUBLICATIONS

Wafer (electronics), Wikipedia, available at https://web.archive.org/web/20150108234225/https://en.wikipedia.org/wiki/Wafer_(electronics) (Year: 2015).*
Extended European Search Report, EP21838962.5, Oct. 20, 2022, 11 pgs.
Kayaku Advanced Materials, "Remover PG Technical Data Sheet", Nov. 1, 2020, pp. 1-2, XP055969743, 2 pgs., Retrieved from the Internet: https://kayakuam.com/wp-content/uploads/2020/11/KAM-Remover-PG-TDS.10.29.20-final.pdf.
Tencent Technology, WO, PCT/CN2021/117270, Dec. 8, 2021, 4 pgs.
Tencent Technology, IPRP, PCT/CN2021/117270, Oct. 3, 2023, 5 pgs.
Tencent Technology, ISR, PCT/CN2021/117270, Dec. 8, 2021, 3 pgs.
Tencent Technology, Korean Office Action, KR Patent Application No. 10-2022-7014613, Jun. 7, 2024, 12 pgs.

\* cited by examiner
† cited by third party (A)  (B)

PHOTORESIST REMOVAL METHOD AND PHOTORESIST REMOVAL SYSTEM

CROSS-REFERENCE TO RELATED APPLICATIONS

This application is a continuation application of PCT Patent Application No. PCT/CN2021/117270, entitled "PHOTORESIST REMOVAL METHOD AND PHOTORESIST REMOVAL SYSTEM" filed on Sep. 8, 2021, which claims priority to Chinese Patent Application No. 202110340148.X, entitled "PHOTORESIST REMOVAL METHOD AND PHOTORESIST REMOVAL SYSTEM", filed with the Chinese Patent Office on Mar. 30, 2021, both of which are incorporated by reference in their entirety.

FIELD OF THE TECHNOLOGY

This application relates to the field of chip manufacturing technologies, and in particular, to a photoresist removal method and a photoresist removal system.

BACKGROUND OF THE DISCLOSURE

In a process of chip manufacturing, a photoresist needs to be used to construct a component, for example, a key component like an air bridge. After the component has been constructed, an excess photoresist needs to be removed.

In the related art, during the removal of a photoresist, a dry photoresist removal method is usually used to remove the photoresist. For example, a plasma stripping method is used to remove the photoresist. During the removal of the photoresist by using the dry photoresist removal method, a high-frequency voltage needs to be applied to trigger reactions between the photoresist and other ions, so as to generate resultants that are easily removable, thereby removing the photoresist.

However, in the above-mentioned method, a high-frequency voltage needs to be applied to trigger related reactions. In this process, the high-frequency voltage bombards a component to cause particular damage to the surface or structure of the component, resulting in low product quality of the obtained component.

SUMMARY

Embodiments of this application provide a photoresist removal method and a photoresist removal system, which can improve the product quality of components while improving the photoresist removal effect. The technical solutions are as follows.

According to an aspect, a photoresist removal method is provided, including:
  acquiring a target wafer, a photoresist being provided on a surface of the target wafer, a surface of a photoresist layer of the photoresist being plated with a metal overhead layer, the metal overhead layer including a three-dimensional hollowed-out structure;
  immersing the target wafer in a first organic solvent at a first temperature in a water bath for a first duration;
  rinsing the target wafer with a new first organic solvent in response to an end of the first duration;
  performing, in the first organic solvent, ultrasonic cleaning on the rinsed target wafer for a second duration based on a target ultrasonic power;
  removing the residual first organic solvent on the surface of the target wafer in response to an end of the second duration; and
  drying the target wafer with the solvent removed, to obtain the target wafer with the photoresist removed via simultaneous gas purging and centrifugal drying.

According to another aspect, a photoresist removal system is provided, including:
  a wafer acquisition device, configured to acquire a target wafer, a photoresist being provided on a surface of the target wafer, a surface of a photoresist layer of the photoresist being plated with a metal overhead layer, the metal overhead layer including a three-dimensional hollowed-out structure;
  a water bath immersion device, configured to immerse the target wafer in a first organic solvent at a first temperature in a water bath for a first duration;
  a rinsing device, configured to rinse the target wafer with a new first organic solvent in response to an end of the first duration;
  an ultrasonic cleaning device, configured to perform, in the first organic solvent, ultrasonic cleaning on the rinsed target wafer for a second duration based on a target ultrasonic power;
  a residual solvent removal device, configured to remove the residual first organic solvent on the surface of the target wafer in response to an end of the second duration; and
  a drying device, configured to dry the target wafer with the solvent removed, to obtain the target wafer with the photoresist removed via simultaneous gas purging and centrifugal drying.

In some embodiments, the ultrasonic cleaning device is configured to: place the rinsed target wafer in a first organic solvent at a second temperature;
  suspend a container containing the first organic solvent at the second temperature on an ultrasonic cleaning water surface, a bottom of the container being in contact with the ultrasonic cleaning water surface; and
  perform the ultrasonic cleaning on the target wafer in the container for the second duration based on the target ultrasonic power.

In some embodiments, the ultrasonic cleaning device is configured to place the rinsed target wafer in the first organic solvent at the second temperature at a target angle.

In some embodiments, the target angle is 45 degrees.

In some embodiments, the target ultrasonic power is the lowest power of the ultrasonic cleaner.

In some embodiments, the residual solvent removal device is configured to: place the target wafer in a second organic solvent in response to the end of the second duration; and
  perform ultrasonic cleaning on the target wafer for a third duration based on the target ultrasonic power to remove the residual first organic solvent on the surface of the target wafer.

In some embodiments, the drying device is configured to: stand the target wafer with the solvent removed on a paper surface to perform preliminary drying; and
  further dry the target wafer after the preliminary drying to obtain the target wafer with the photoresist removed.

In some embodiments, the centrifugal drying is centrifugally rotating the target wafer at a target rotation speed for a fourth duration.

In some embodiments, the target rotation speed is 3000 revolutions per minute (rpm).

In some embodiments, the fourth duration is 35 seconds.

In some embodiments, the first organic solvent is a Remover PG solvent, the first temperature is 80° C., and the first duration is 96 hours.

In some embodiments, the first organic solvent is an N-methylpyrrolidone (NMP) solvent, the first temperature is 85° C., and the first duration is 4 hours.

In some embodiments, the metal overhead layer is an air bridge structure.

According to another aspect, a production line device is provided, including: a water bath immersion unit, a rinser, an ultrasonic cleaner, and a centrifuge, the water bath immersion unit being configured to immerse a target wafer in a first organic solvent at a first temperature in a water bath for a first duration, a photoresist being provided on a surface of the target wafer, a surface of a photoresist layer of the photoresist being plated with a metal overhead layer, the metal overhead layer including a three-dimensional hollowed-out structure;

the rinser being configured to rinse the target wafer with a new first organic solvent in response to an end of the first duration;

the ultrasonic cleaner being configured to: perform, in the first organic solvent, ultrasonic cleaning on the rinsed target wafer for a second duration based on a target ultrasonic power, and remove the residual first organic solvent on the surface of the target wafer in response to an end of the second duration; and the centrifuge being configured to dry the target wafer with the solvent removed, to obtain the target wafer with the photoresist removed via simultaneous gas purging and centrifugal drying.

In some embodiments, the ultrasonic cleaner is configured to perform the ultrasonic cleaning on the target wafer in a container for the second duration based on the target ultrasonic power;

the container contains a first organic solvent at a second temperature and holds the rinsed target wafer; and the container is suspended on an ultrasonic cleaning water surface, and a bottom of the container being in contact with the ultrasonic cleaning water surface.

In some embodiments, the ultrasonic cleaner is configured to perform the ultrasonic cleaning for the second duration based on the target ultrasonic power on the rinsed target wafer placed in the first organic solvent at the second temperature at a target angle.

In some embodiments, the target angle is 45 degrees.

In some embodiments, the target ultrasonic power is the lowest power of the ultrasonic cleaner.

In some embodiments, the ultrasonic cleaner is configured to: replace the first organic solvent with a second organic solvent in response to an end of the second duration; and perform ultrasonic cleaning on the target wafer for a third duration based on the target ultrasonic power to remove the residual first organic solvent on the surface of the target wafer.

In some embodiments, the centrifuge is configured to further dry the target wafer after preliminary drying to obtain the target wafer with the photoresist removed, the preliminary drying being standing the target wafer with the solvent removed on a paper surface.

In some embodiments, the centrifugal drying is centrifugally rotating the target wafer at a target rotation speed for a fourth duration.

In some embodiments, the target rotation speed is 3000 rpm.

In some embodiments, the fourth duration is 35 seconds.

In some embodiments, the first organic solvent is a Remover PG solvent, the first temperature is 80° C., and the first duration is 96 hours.

In some embodiments, the first organic solvent is an NMP solvent, the first temperature is 85° C., and the first duration is 4 hours.

In some embodiments, the metal overhead layer is an air bridge structure.

According to another aspect, a non-transitory computer-readable storage medium is provided, the readable storage medium storing at least one computer program, the at least one computer program being loaded and executed by a processor to implement the above-mentioned photoresist removal method.

The technical solutions provided in this application may include the following beneficial effects.

A photoresist is provided on a surface of a target wafer, and a surface of a photoresist layer of the photoresist is plated with a metal overhead layer. After being immersed in a first organic solvent at a first temperature in a water bath for a first duration, the target wafer is rinsed with a new first organic solvent. Ultrasonic cleaning is performed on the target wafer in the first organic solvent, where the ultrasonic cleaning uses a target ultrasonic power to perform solvent removal and drying on the cleaned target wafer to obtain the target wafer with the photoresist removed. In a photoresist removal process, the same type of photoresist removal solvent (a first organic solvent) can be used to remove the photoresist through two steps (water bath immersion and ultrasonic cleaning), which reduces residual photoresist and improves the treatment effect of the photoresist. In addition, the target wafer after wet treatment is dried through a combination of centrifugal drying and gas purging, which avoids damage to metal devices because it is not easy to control gas flow in a process of gas purging only, and improves the product quality of the obtained metal devices.

BRIEF DESCRIPTION OF THE DRAWINGS

Accompanying drawings herein are incorporated into a specification and constitute a part of this specification, show embodiments that conform to this application, and are used for describing a principle of this application together with this specification.

DESCRIPTION OF EMBODIMENTS

Figure 1:
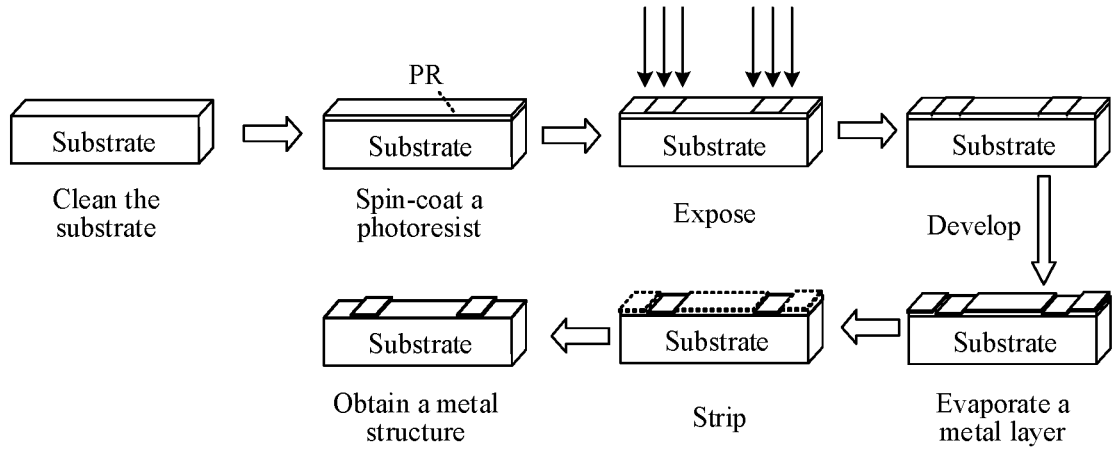
FIG. 1 is a schematic diagram of a Lift-Off process according to an exemplary embodiment of this application.

Exemplary embodiments are described in detail herein, and examples of the exemplary embodiments are shown in the accompanying drawings. When the following description involves the accompanying drawings, unless otherwise indicated, the same numerals in different accompanying drawings represent the same or similar elements. The implementations described in the following exemplary embodiments do not represent all implementations that are consistent with this application. On the contrary, the implementations are merely examples of devices and methods that are described in detail in the appended claims and that are consistent with some aspects of this application.

A plurality of mentioned in the specification means two or more. And/or describes an association relationship for associated objects and represents that three relationships may exist. For example, A and/or B may represent the following three cases: only A exists, both A and B exist, and only B exists. The character "/" in this specification generally indicates an "or" relationship between the associated objects.

Embodiments of this application provide a photoresist removal method, which can improve the treatment effect of photoresist and enhance the product quality of the obtained metal devices. For ease of understanding, several terms involved in this application are explained below.

1) Wafer

A wafer is a silicon wafer used in manufacturing a silicon semiconductor integrated circuit, mostly made of silicon/sapphire and another material. various circuit element structures may be treated on the silicon wafer. Schematically, the wafer may be used as a chip substrate.

2) Photoresist (PR)

A photoresist is one of the key materials for micro-pattern treatment in microelectronics technologies, which can be used to coat a photosensitive polymer on a surface of a chip substrate. Chemical reactions may occur during a photolithography step, and then a desired pattern is formed in combination with a developer.

The photoresist includes a negative photoresist and a positive photoresist. Under irradiation of an energy beam (a light beam, an electron beam, an ion beam, or the like), a photoresist with dominating cross-linking reactions is called a negative photoresist. Under irradiation of an energy beam (a beam, an electron beam, an ion beam, or the like), a photoresist with dominating photodecomposition reactions is called positive photoresist.

Based on different properties of different types of photoresists, there are two corresponding processes: negative photolithography and positive photolithography. A basic feature of the negative photolithography is that after exposure, the photoresist becomes insoluble and hardens due to cross-linking. Once hardened, the cross-linked photoresist cannot be washed away in a solvent, and a pattern on the photoresist is opposite to a pattern on a projection mask. A pattern copied to a surface of a silicon wafer by the positive lithography is the same as that on the projection mask. A region exposed to ultraviolet light undergoes a chemical reaction, which is softened in the developer and can be dissolved in the developer. An exposed positive photoresist region is removed in the developer, and an unexposed photoresist under an opaque projection mask remains on the silicon wafer.

3) Reflow

Reflow is that a specific photoresist is heated to deform and shrink to form an arch.

4) Air Bridge/Vacuum Bridge

An air bridge is a cross-interconnection method with low parasitic effects, so that cross-line connections can be implemented and signal crosstalk between transmission lines in a chip can be effectively suppressed.

An independent air bridge can be called a discrete air bridge. A series of air bridges are all connected to form an entire air bridge, which is called an all-inclusive air bridge.

During chip manufacturing, a Lift-Off process (stripping process) is usually used to obtain a target device such as an air bridge. FIG. 1 is a schematic diagram of a Lift-Off process according to an exemplary embodiment of this application. As shown in FIG. 1, a procedure of the Lift-Off process includes: 1. cleaning a substrate, a wafer being generally implemented as the substrate; 2. coating a layer of a photoresist on the clean substrate, where the photoresist may be covered by spin coating, so that the photoresist is evenly coated; 3. placing the photoresist-coated substrate in a laser direct writer to record a layout and exposing the layout; 4. immersing the exposed substrate in a chemical solvent for development, where in this process, and if the coated photoresist is a positive photoresist, an exposed part is dissolved in a developer to form a corresponding shape, or if the coated photoresist is a negative photoresist, an unexposed part is dissolved in the developer, to leave a corresponding shape; 5. based on a surface of a structured photoresist layer, a metal film material being plated on the top of the surface of the structured photoresist layer to form a metal overhead layer, where in this process, a vertical evaporation method may be adopted, a positive photoresist is used as an example, and the metal film material is in direct contact with a substrate below the photoresist when the metal film material enters a structured part, so that there is corresponding adhesion to form a metal structure; 6. using an organic solvent to strip a metal structure from the substrate; and 7. acquiring the metal structure.

As a pattern transfer medium between a photolithography mask and a surface of a silicon wafer, and a barrier layer of an etched region or an ion implanted region, the photoresist is no longer useful on the surface of the wafer once an etching operation or an implantation operation is completed, and needs to be removed as completely as possible. In addition, any residues caused by an etching process are also to be removed as much as possible, or otherwise the performance of a chip is affected. To improve the photoresist removal effect, this application provides a photoresist removal method, which can effectively remove a residual photoresist while ensuring the integrity of a component structure. The photoresist removal method shown in this application can be performed by a production line device. The production line device may be implemented as an application-controlled manipulator, a photoresist removal device in an application-controlled pipeline, or the like.

The photoresist removal method provided in this application may be applied to a manufacturing process of chip components of various chips, schematically, may be applied to the manufacturing process of chip components of a quantum chip. During manufacturing of the chip components of the quantum chip, the photoresist removal method provided in this application can effectively remove a residual photoresist on a wafer plated with a metal overhead layer, thereby improving the quality of the metal overhead layer, and further enhancing the performance of the metal overhead layer. For example, when the metal overhead layer is an air bridge structure, a shielding function of the air bridge structure against crosstalk between transmission lines can be improved.

Figure 2:
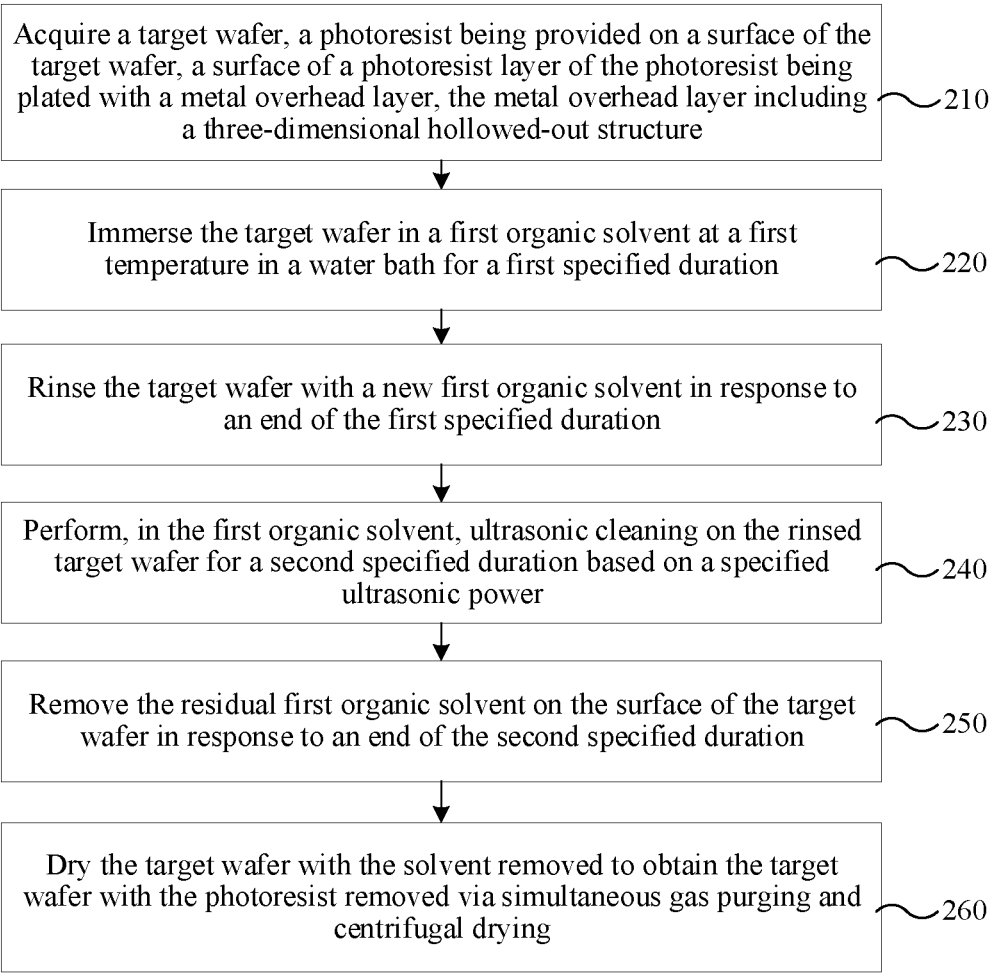
FIG. 2 is a flowchart of a photoresist removal method according to an exemplary embodiment of this application.

FIG. 2 is a flowchart of a photoresist removal method according to an exemplary embodiment of this application.

The method may be performed by a production line device shown in FIG. 2. The method includes the following steps:

Step 210. Acquire a target wafer, a photoresist being provided on a surface of the target wafer, a surface of a photoresist layer of the photoresist being plated with a metal overhead layer, the metal overhead layer including a three-dimensional hollowed-out structure.

The target wafer is coated with the photoresist, and the target wafer is a wafer to be subjected to photoresist removal after a metal plating process is performed on the photoresist layer to form a target component structure.

Step 220. Immerse the target wafer in a first organic solvent at a first temperature in a water bath for a first duration.

In some embodiments, the first temperature corresponds to a type of the first organic solvent, and the first duration corresponds to the type of the first organic solvent.

In some embodiments, the first temperature is a temperature determined based on a use instruction data sheet of the first organic solvent. Schematically, the first temperature is a target temperature that enables the first organic solvent to be effective in a temperature range.

The first organic solvent is used to dissolve a photoresist on a target wafer to remove the excess photoresist.

A depth of the first organic solvent is greater than or equal to a thickness of the target wafer, so that the target wafer can be immersed in the first organic solvent.

Step 230. Rinse the target wafer with a new first organic solvent in response to an end of the first duration.

A new first organic solvent is an unused first organic solvent, that is, a first organic solvent that is not contaminated by the environment.

Rinsing the target wafer is using the flowing first organic solvent to rinse off the residual used first organic solvent on the surface of the target wafer.

Step 240. Perform, in the first organic solvent, ultrasonic cleaning on the rinsed target wafer for a second duration based on a target ultrasonic power.

In some embodiments, an ultrasonic cleaner is used to perform ultrasonic cleaning on the target wafer. In a process of performing the ultrasonic cleaning on the target wafer, the target wafer needs to be immersed in the first organic solvent to further clean the residual photoresist.

Step 250. Remove the residual first organic solvent on the surface of the target wafer in response to an end of the second duration.

The residual first organic solvent has particular impact on the performance of the metal overhead layer, for example, affects the electrical performance of the metal overhead layer. Therefore, after the excess residual photoresist on the target wafer is removed by the first organic solvent, to reduce the impact of the residual first organic solvent on the performance of the metal overhead layer on the target wafer, the residual first organic solvent on the surface of the target wafer needs to be removed. Therefore, after the photoresist on the surface of the wafer is removed by the first organic solvent, that is, after the second duration is over, the residual first organic solvent on the surface of the target wafer is removed.

Step 260. Dry the target wafer with the solvent removed to obtain the target wafer with the photoresist removed via simultaneous gas purging and centrifugal drying.

In some embodiments, a gas used for gas purging is nitrogen ($N_2$).

In summary, in the photoresist removal method provided in this application, a photoresist is provided on a surface of a target wafer, and a surface of a photoresist layer of the photoresist is plated with a metal overhead layer. After being immersed in a first organic solvent at a first temperature in a water bath for a first duration, the target wafer is rinsed with a new first organic solvent. Subsequently, ultrasonic cleaning is performed on the target wafer in the first organic solvent, where the ultrasonic cleaning uses a target ultrasonic power to perform solvent removal and drying on the cleaned target wafer to obtain the target wafer with the photoresist removed. In a photoresist removal process, the same type of photoresist removal solvent (a first organic solvent) can be used to remove the photoresist through two steps (water bath immersion and ultrasonic cleaning), which reduces residual photoresist and improves the treatment effect of the photoresist. In addition, the target wafer after wet treatment is dried through a combination of centrifugal drying and gas purging, which avoids damage to metal devices because it is not easy to control gas flow in a process of gas purging only, and improves the product quality of the obtained metal devices.

The photoresist removal method provided in this application may be applied to a scenario of performing photoresist removal on a three-dimensional structure during chip manufacturing. Schematically, the photoresist removal method shown in this application may be used in a manufacturing scenario of an all-inclusive air bridge releasing a photoresist layer bridge brace.

Figure 3:
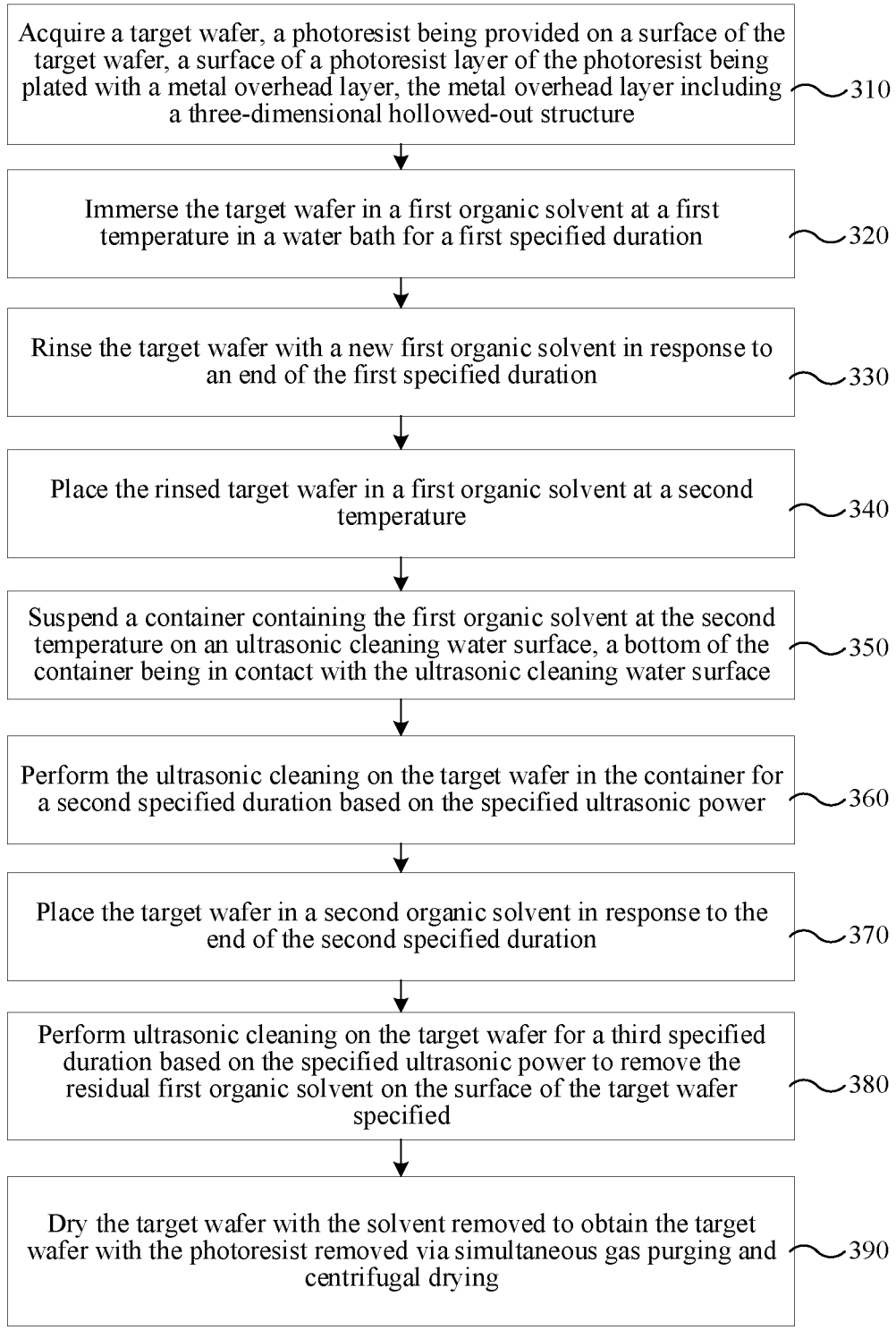
FIG. 3 is a flowchart of a photoresist removal method according to an exemplary embodiment of this application.

In some embodiments, a target wafer in an embodiment of this application is a wafer used for manufacturing an air bridge structure during chip manufacturing, and the air bridge structure is used for shielding against microwave crosstalk between transmission lines. Because the air bridge structure is a three-dimensional structure, in a manufacturing process of the air bridge structure, upper and lower polymers need to be released on the premise that the shape of an intermediate layer remains unchanged. FIG. 3 is a flowchart of a photoresist removal method according to an exemplary embodiment of this application. The method may be performed by a production line device shown in FIG. 3. The method includes the following steps:

Step 310. Acquire a target wafer, a photoresist being provided on a surface of the target wafer, a surface of a photoresist layer of the photoresist being plated with a metal overhead layer, the metal overhead layer including a three-dimensional hollowed-out structure.

In some embodiments, the metal overhead layer is an air bridge structure, and the air bridge structure may be an independent air bridge, that is, a separate air bridge. Alternatively, the air structure is an entire air bridge formed by a series of air bridges, that is, an all-inclusive air bridge. An embodiment of this application is described by using an example in which the air bridge structure is an all-inclusive air bridge.

The target wafer may be a wafer having an air bridge structure etched after reflow and has not undergone a photoresist removal step.

Step 320. Immerse the target wafer in a first organic solvent at a first temperature in a water bath for a first duration.

In some embodiments, the process can be achieved as follows. After being placed flat in a developing flower basket, the target wafer is placed in a container, the first organic solvent is poured into the container, and a depth of the first organic solvent is greater than or equal to a thickness of the target wafer, so that the target wafer is immersed in the first organic solvent, and the first organic solvent can fully act on the excess photoresist on the surface of the target wafer.

The first duration starts when a temperature of the first organic solvent reaches the first temperature, that is, in response to the temperature of the first organic solvent reaching the first temperature, a timer is started, and the timer is used to count a duration of the first temperature.

In some embodiments, the first temperature may be a temperature of a water bath for heating the first organic solvent. Being heated in a water bath, the first organic solvent can be evenly heated, thereby improving the photoresist removal effect of the first organic solvent.

In some embodiments, the first organic solvent is a Remover PG solvent, the first temperature corresponding to the first organic solvent is 80° C., and the first duration is 96 hours.

In another possible implementation, the first organic solvent is an NMP solvent, a corresponding first temperature is 85° C., and the first duration is 4 hours.

Step 330. Rinse the target wafer with a new first organic solvent in response to an end of the first duration.

In some embodiments, the target wafer is rinsed with a new first organic solvent at room temperature in response to an end of the first duration.

The room temperature is a constant temperature of a chip manufacturing environment (clean room), and the constant temperature is 22° C.

Step 340. Place the rinsed target wafer in a first organic solvent at a second temperature.

To improve the cleaning effect of ultrasonic cleaning, in a possible implementation, the rinsed target wafer is placed in the first organic solvent at the second temperature at a target angle.

The target angle is 45°.

Schematically, to place the rinsed target wafer in the first organic solvent at the second temperature at a target angle, during the placement of the target wafer, the target wafer may be placed in the developing flower basket with the same diameter of the target wafer, so that one end of the target wafer is in contact with the center of the developing flower basket, and the other end is in contact with a support rod of the developing flower basket. The target wafer placed in the above form is placed in a container containing the first organic solvent, so that the target wafer is placed in the first organic solvent at the target angle.

Step 350. Suspend a container containing the first organic solvent at the second temperature on an ultrasonic cleaning water surface, a bottom of the container being in contact with the ultrasonic cleaning water surface.

Because a three-dimensional structure is relatively fragile, ultrasonic cleaning tends to cause damage to the three-dimensional structure. For example, an air bridge structure is a hollowed-out structure, and the ultrasonic cleaning tends to cause collapse and deformation of the air bridge structure. Therefore, in an ultrasonic cleaning process, a contact area between the container and the ultrasonic cleaning water surface needs to be reduced. In the embodiments of this application, the container containing the first organic solvent at the second temperature is suspended on the ultrasonic cleaning water surface, and a bottom of the container is in contact with the ultrasonic cleaning water surface, so that the container is only in contact with the vibration of the water surface, thereby reducing the impact of ultrasound on the three-dimensional structure in the container.

In some embodiments, the second temperature is room temperature, that is, a constant temperature of the clean room, for example, 22° C.

Step 360. Perform the ultrasonic cleaning on the target wafer in the container for a second duration based on the target ultrasonic power.

To reduce the damage to a bridge body of the three-dimensional structure (air bridge structure) caused by the ultrasound in the ultrasonic cleaning process, in a possible implementation, the target ultrasonic power used in the ultrasonic cleaning process is the lowest power of an ultrasonic cleaner. The lowest power is 35% Power, and the lowest power is the lowest vibration power of the ultrasonic cleaner.

In some embodiments, the second duration is 5 min.

Step 370. Place the target wafer in a second organic solvent in response to the end of the second duration.

In some embodiments, the target wafer after ultrasonic cleaning is removed from the first organic solvent within a target duration, and the target duration is as short as possible; and then the target wafer is placed in the second organic solvent.

Schematically, the second organic solvent may be implemented as an organic solvent soluble with the first organic solvent, for example, an isopropyl alcohol (IPA) solvent.

Step 380. Perform ultrasonic cleaning on the target wafer for a third duration based on the target ultrasonic power to remove the residual first organic solvent on the surface of the target wafer.

In some embodiments, a process of performing the ultrasonic cleaning on the target wafer in the second organic solvent with the target ultrasonic power may be the same as a process of performing the ultrasonic cleaning on the target wafer in the first organic solvent with the target ultrasonic power. That is, in a process in which the ultrasonic cleaning is performed on the target wafer in the second organic solvent with the target ultrasonic power, the target wafer is immersed in the second organic solvent at the target angle, the container containing the second organic solvent is suspended on the ultrasonic cleaning water surface, and a bottom of the container is in contact with the ultrasonic cleaning water surface.

The ultrasonic cleaning can be performed at room temperature (22° C.) on the target wafer in the second organic solvent with the target ultrasonic power.

In some embodiments, the third duration is equal to the second duration, that is, the second duration is 5 min, and the third duration is also 5 min.

Step 390. Dry the target wafer with the solvent removed, to obtain the target wafer with the photoresist removed via simultaneous gas purging and centrifugal drying.

In some embodiments, the drying the target wafer may be implemented as:
standing the target wafer with the solvent removed on a paper surface to perform preliminary drying; and
further drying the target wafer after the preliminary drying to obtain the target wafer with the photoresist removed,
A process of the preliminary drying may be implemented as follows: standing the target wafer taken out of the second organic solvent on a paper surface of absorbent paper, so that the residual second organic solvent on the surface of the target wafer gathers at a contact point between the target wafer and the paper surface, and the absorbent paper absorbs the residual second organic solvent on the target wafer. After the preliminary drying, the target wafer is further dried by centrifugal drying in combination with gas purging.

In some embodiments, the centrifugal drying is rotating the target wafer at a target speed for a fourth duration. The fourth duration is 35 s, and the target rotation speed is 3000 rpm.

The rotating the target wafer at the target speed may be implemented by placing the target wafer on a spin-coating flat plate and controlling a rotation speed of the spin-coating flat plate to be 3000 rpm, where the rotation duration is 35 s.

In summary, in the photoresist removal method provided in embodiments of this application, a photoresist is provided on a surface of a target wafer, and a surface of a photoresist layer of the photoresist is plated with a metal overhead layer. After being immersed in a first organic solvent at a first temperature in a water bath for a first duration, the target wafer is rinsed with a new first organic solvent. Ultrasonic cleaning is performed on the target wafer in the first organic solvent, where the ultrasonic cleaning uses a target ultrasonic power to perform solvent removal and drying on the cleaned target wafer to obtain the target wafer with the photoresist removed. In a photoresist removal process, the same type of photoresist removal solvent (a first organic solvent) can be used to remove the photoresist through two steps (water bath immersion and ultrasonic cleaning), which reduces residual photoresist and improves the treatment effect of the photoresist. In addition, the target wafer after wet treatment is dried through a combination of centrifugal drying and gas purging, which avoids damage to metal devices because it is not easy to control gas flow in a process of gas purging only, and improves the product quality of the obtained metal devices.

Figure 4:
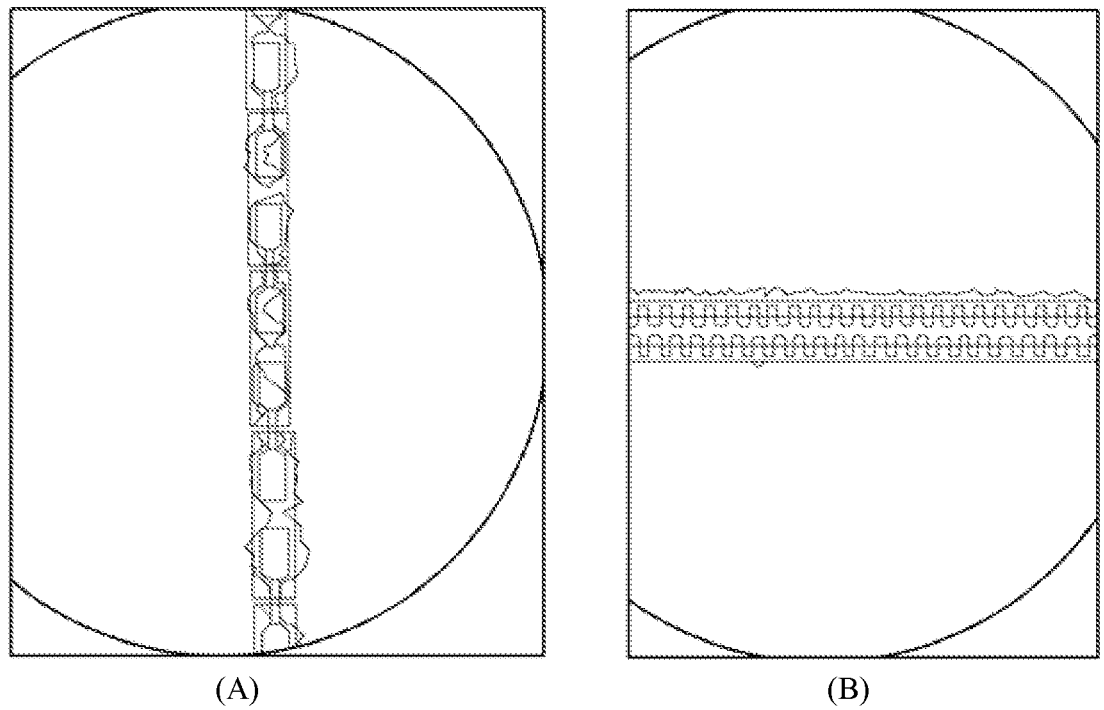
FIG. 4 and FIG. 5 show images of an air bridge structure after photoresist removal according to the related technologies.
Figure 5:
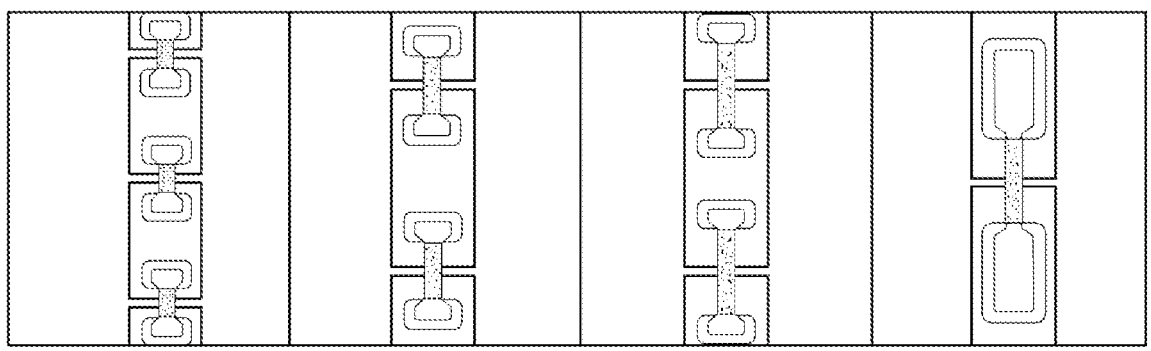

In a process of removing the photoresist of the three-dimensional structure, the photoresist removal effect can be improved while reducing a structural damage to the three-dimensional structure. An air bridge structure is used as an example. FIG. 4 and FIG. 5 show images of the air bridge structure with the photoresist removed based on related technologies. A part A in FIG. 4 corresponds to a schematic diagram of a discrete air bridge structure under an optical microscope, and a Part B in FIG. 4 corresponds to a schematic diagram of an all-inclusive air bridge structure under an optical microscope. As shown in FIG. 4, after the photoresist is removed based on related technologies, there is still a residual photoresist attached around the air bridge structure. As shown in FIG. 5, after the photoresist is removed based on related technologies, discrete air bridges of different sizes can be observed under a confocal microscope, and it can be observed that a surface structure of a bridge body of the air bridge structure is damaged.

Figure 6:
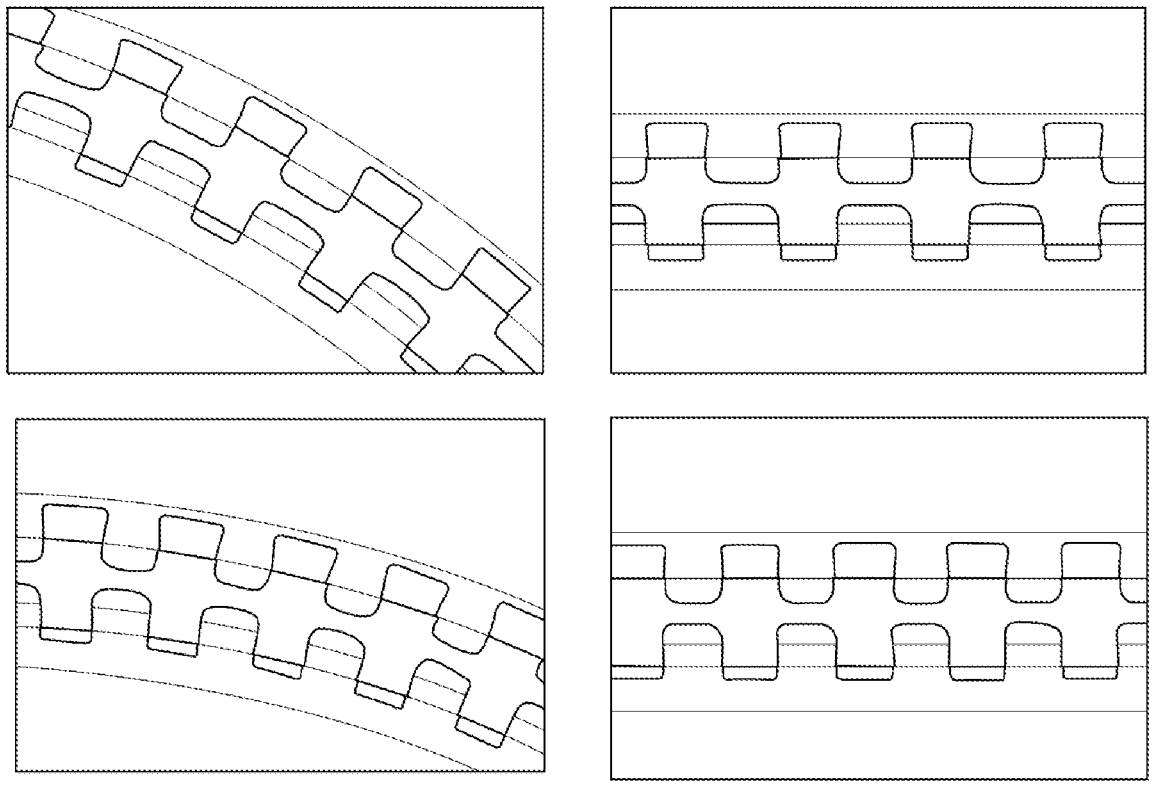
FIG. 6 and FIG. 7 show images of an air bridge structure after being treated according to a photoresist removal method provided in this application.
Figure 7:
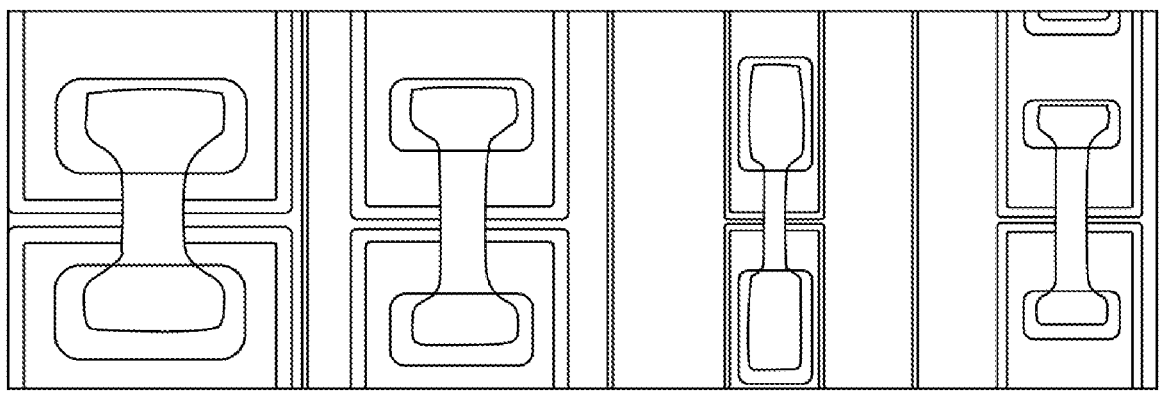

Compared with the images of the air bridge structure shown in FIG. 4 and FIG. 5, FIG. 6 and FIG. 7 show images of the air bridge structure treated based on the photoresist removal method provided in this application. As shown in FIG. 6, based on the all-inclusive air bridge structure treated by the photoresist removal method provided in this application, under an electron microscope, there is no residual photoresist on the top and bottom of a bridge body structure, the shape of the air bridge structure remains intact, and there is no collapse or fracture. As shown in FIG. 7, the photoresist removal method provided in this application is used in air bridge structures of different sizes, and all can achieve a stable effect.

Figure 8:
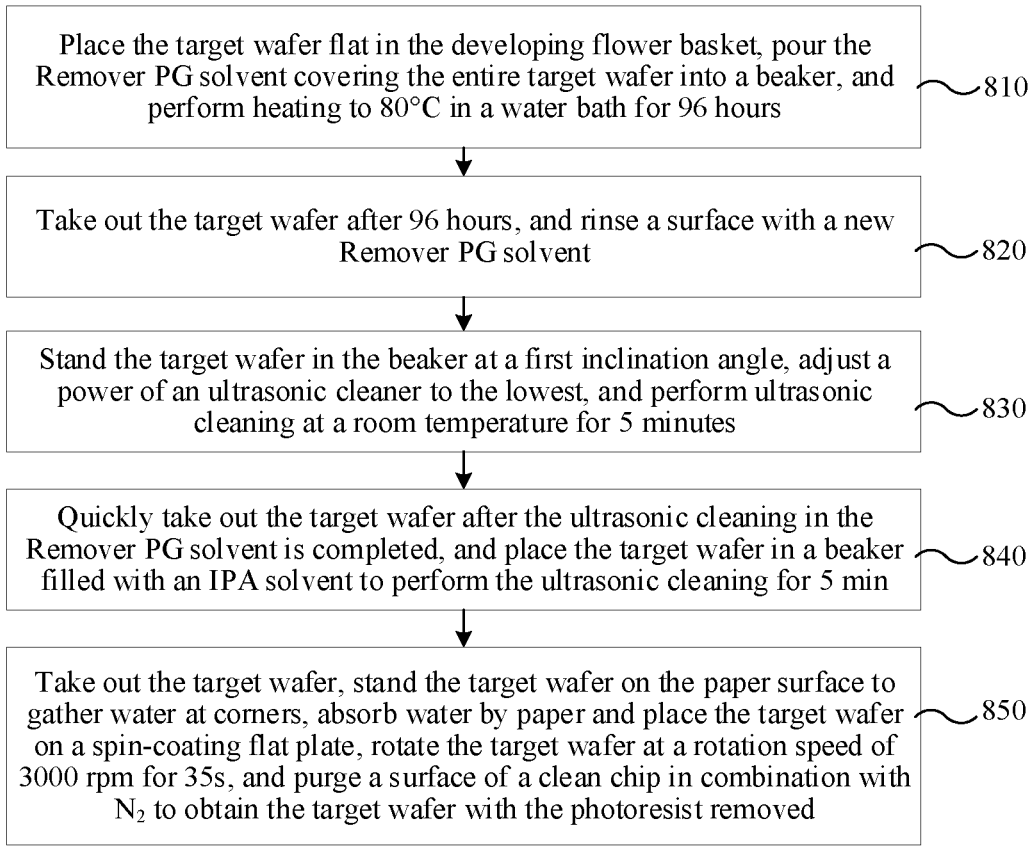
FIG. 8 is a flowchart of a photoresist treatment method according to an exemplary embodiment of this application.

For example, a process of the all-inclusive air bridge releasing a photoresist layer bridge brace, and the first organic solvent being Remover PG solvent. FIG. 8 is a flowchart of a photoresist treatment method according to an exemplary embodiment of this application. As shown in FIG. 8, the method includes the following steps:

Step 810. Place the target wafer flat in the developing flower basket, pour the Remover PG solvent covering the entire target wafer into a beaker, and perform heating to 80° C. in a water bath for 96 hours.

The target wafer is a wafer with an air bridge structure etched after reflow and has not undergone a photoresist removal step, and a diameter of the target wafer is 2 inches.

The water bath duration is measured from a moment at which the temperature of the water bath reaches 80° C.

Step 820. Take out the target wafer after 96 hours, and rinse a surface with a new Remover PG solvent.

Step 830. Stand the target wafer in the beaker at a first inclination angle, adjust a power of an ultrasonic cleaner to the lowest, and perform ultrasonic cleaning at a room temperature for 5 min.

The first inclination angle is 45°, the power of the ultrasonic cleaner is 35% Power, and in an ultrasonic cleaning process, the beaker is kept lifted for the beaker to be only in contact with a vibration of the water surface.

Step 840. Quickly take out the target wafer after the ultrasonic cleaning in the Remover PG solvent is completed, and place the target wafer in a beaker filled with an IPA solvent to perform the ultrasonic cleaning for 5 min.

An operation mode in the ultrasonic cleaning process in step 840 is the same as that in step 830.

Step 850. Take out the target wafer, stand the target wafer on the paper surface to gather water at corners, absorb water by paper and place the target wafer on a spin-coating flat plate, rotate the target wafer at a rotation speed of 3000 rpm for 35 s, and purge a surface of a clean chip in combination with $N_2$ to obtain the target wafer with the photoresist removed.

In summary, in the photoresist removal method provided in the embodiments of this application, a photoresist is provided on a surface of a target wafer, and a surface of a photoresist layer of the photoresist is plated with a metal overhead layer. After being immersed in a first organic solvent at a first temperature in a water bath for a first duration, the target wafer is rinsed with a new first organic solvent. Ultrasonic cleaning is performed on the target wafer in the first organic solvent, where the ultrasonic cleaning uses a target ultrasonic power to perform solvent removal and drying on the cleaned target wafer to obtain the target wafer with the photoresist removed, which can achieve a better photoresist removal effect, so that the surface of the target wafer shows a clear photolithography structure. In addition, for a three-dimensional structure, it is possible to reduce damage to the surface of the three-dimensional structure while improving the photoresist removal effect, thereby enhancing the quality of the three-dimensional structure.

Figure 9:
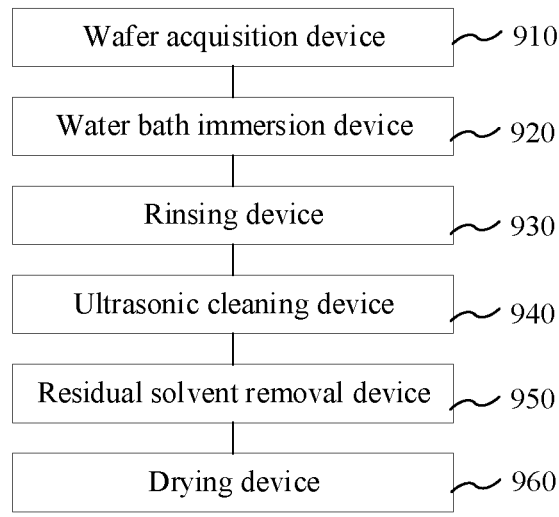
FIG. 9 is a schematic diagram of a photoresist removal system according to an exemplary embodiment of this application.

FIG. 9 is a schematic diagram of a photoresist removal system according to an exemplary embodiment of this application. As shown in FIG. 9, the photoresist removal system includes:

a wafer acquisition device 910, configured to acquire a target wafer, a photoresist being provided on a surface of the target wafer, a surface of a photoresist layer of the photoresist being plated with a metal overhead layer, the metal overhead layer including a three-dimensional hollowed-out structure;

a water bath immersion device 920, configured to immerse the target wafer in a first organic solvent at a first temperature in a water bath for a first duration;

a rinsing device 930, configured to rinse the target wafer with a new first organic solvent in response to an end of the first duration;

an ultrasonic cleaning device 940, configured to perform, in the first organic solvent, ultrasonic cleaning on the rinsed target wafer for a second duration based on a target ultrasonic power;

a residual solvent removal device 950, configured to remove the residual first organic solvent on the surface of the target wafer in response to an end of the second duration; and a drying device 960, configured to dry the target wafer with the solvent removed to obtain the target wafer with the photoresist removed via simultaneous gas purging and centrifugal drying.

In some embodiments, the ultrasonic cleaning device 940 is configured to: place the rinsed target wafer in a first organic solvent at a second temperature;

suspend a container containing the first organic solvent at the second temperature on an ultrasonic cleaning water surface, a bottom of the container being in contact with the ultrasonic cleaning water surface; and perform the ultrasonic cleaning on the target wafer in the container for the second duration based on the target ultrasonic power.

In some embodiments, the ultrasonic cleaning device 940 is configured to place the rinsed target wafer in the first organic solvent at the second temperature at a target angle.

In some embodiments, the target angle is 45 degrees.

In some embodiments, the target ultrasonic power is the lowest power of an ultrasonic cleaner.

In some embodiments, the residual solvent removal device 950 is configured to: place the target wafer in a second organic solvent in response to the end of the second duration; and perform ultrasonic cleaning on the target wafer for a third duration based on the target ultrasonic power to remove the residual first organic solvent on the surface of the target wafer.

In some embodiments, the drying device 960 is configured to: stand the target wafer with the solvent removed on a paper surface to perform preliminary drying; and further dry the target wafer after the preliminary drying to obtain the target wafer with the photoresist removed.

In some embodiments, the centrifugal drying is centrifugally rotating the target wafer at a target rotation speed for a fourth duration.

In some embodiments, the target rotation speed is 3000 rpm.

In some embodiments, the fourth duration is 35 seconds.

In some embodiments, the first organic solvent is a Remover PG solvent, the first temperature is 80° C., and the first duration is 96 hours.

In some embodiments, the first organic solvent is an NMP solvent, the first temperature is 85° C., and the first duration is 4 hours.

In some embodiments, the metal overhead layer is an air bridge structure.

Various devices in the photoresist removal system shown in the embodiments of this application may be implemented as various manipulators for implementing corresponding functions or performing corresponding steps, or may be implemented as various devices on the photoresist removal assembly line, which is not limited in this application.

In summary, in the photoresist removal system provided in embodiments of this application, a photoresist is provided on a surface of a target wafer, and a surface of a photoresist layer of the photoresist is plated with a metal overhead layer. After being immersed in a first organic solvent at a first temperature in a water bath for a first duration, the target wafer is rinsed with a new first organic solvent. Ultrasonic cleaning is performed on the target wafer in the first organic solvent, where the ultrasonic cleaning uses a target ultrasonic power to perform solvent removal and drying on the cleaned target wafer to obtain the target wafer with the photoresist removed. in a photoresist removal process, the same type of photoresist removal solvent (a first organic solvent) can be used to remove the photoresist through two steps (water bath immersion and ultrasonic cleaning), which reduces residual photoresist. In addition, the target wafer after wet treatment is dried through a combination of centrifugal drying and gas purging, which avoids damage to metal devices because it is not easy to control gas flow in a process of gas purging only, and improves the product quality of the obtained metal devices.

Figure 10:
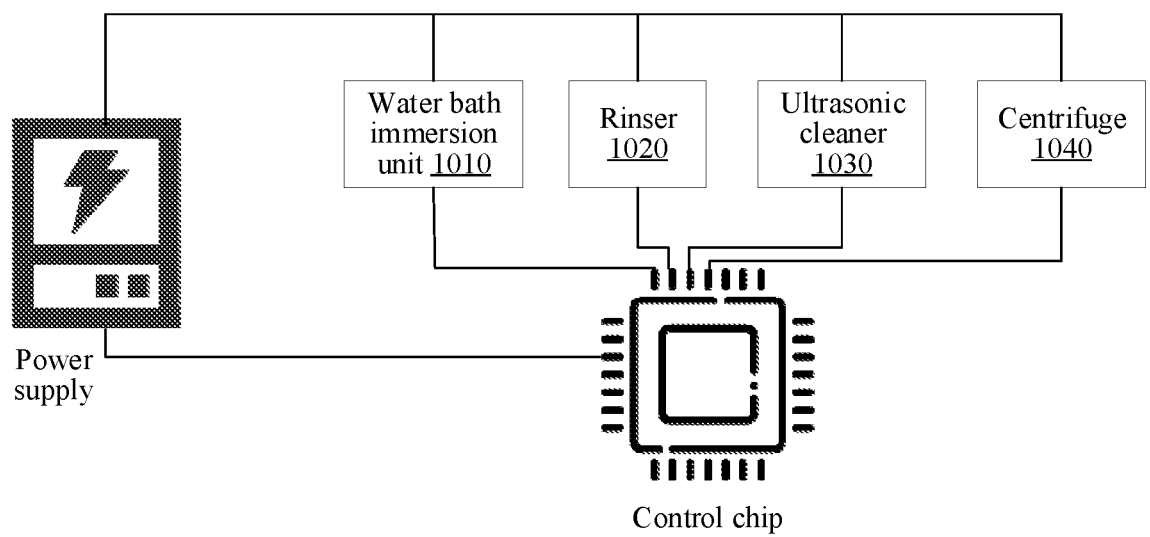
FIG. 10 is a schematic diagram of a production line device according to an exemplary embodiment of this application.

FIG. 10 is a schematic diagram of a production line device according to an exemplary embodiment of this application. As shown in FIG. 10, the production line device includes a water bath immersion unit 1010, a rinser 1020, an ultrasonic cleaner 1030, a centrifuge 1040, and the like.

The water bath immersion unit 1010 is configured to immerse a target wafer in a first organic solvent at a first temperature in a water bath for a first duration, a photoresist being provided on a surface of the target wafer, a surface of a photoresist layer of the photoresist being plated with a metal overhead layer, the metal overhead layer including a three-dimensional hollowed-out structure.

The rinser 1020 is configured to rinse the target wafer with a new first organic solvent in response to an end of the first duration.

The ultrasonic cleaner 1030 is configured to: perform, in the first organic solvent, ultrasonic cleaning on the rinsed target wafer for a second duration based on a target ultrasonic power, and remove the residual first organic solvent on the surface of the target wafer in response to an end of the second duration.

The centrifuge 1040 is configured to dry the target wafer with the solvent removed to obtain the target wafer with the photoresist removed via simultaneous gas purging and centrifugal drying.

In some embodiments, the ultrasonic cleaner is configured to perform the ultrasonic cleaning on the target wafer in a container for the second duration based on the target ultrasonic power;

the container contains a first organic solvent at a second temperature and holds the rinsed target wafer; and the container is suspended on an ultrasonic cleaning water surface, a bottom of the container being in contact with the ultrasonic cleaning water surface.

In some embodiments, the ultrasonic cleaner is configured to perform the ultrasonic cleaning for the second duration based on the target ultrasonic power on the rinsed target wafer placed in the first organic solvent at the second temperature at a target angle.

In some embodiments, the target angle is 45 degrees.

In some embodiments, the target ultrasonic power is the lowest power of an ultrasonic cleaner.

In some embodiments, the ultrasonic cleaner is configured to: replace the first organic solvent with a second organic solvent in response to an end of the second duration; and perform ultrasonic cleaning on the target wafer for a third duration based on the target ultrasonic power to remove the residual first organic solvent on the surface of the target wafer.

Optionally, the ultrasonic cleaner containing the first organic solvent and the ultrasonic cleaner containing the second organic solvent may be different ultrasonic cleaners. Schematically, after the ultrasonic cleaning of the target wafer is completed in a first ultrasonic cleaner (the ultrasonic cleaner containing the first organic solvent), the target wafer can be moved to a second ultrasonic cleaner (the ultrasonic cleaner containing the second organic solvent) through a robotic arm or a conveyor belt, and the ultrasonic cleaning is performed on the target wafer for a third duration in the second ultrasonic cleaner to remove the residual first organic solvent on the surface of the target wafer.

In some embodiments, the centrifuge is configured to further dry the target wafer after preliminary drying to obtain the target wafer with the photoresist removed, the preliminary drying being standing the target wafer with the solvent removed on a paper surface.

In some embodiments, the centrifugal drying is centrifugally rotating the target wafer at a target rotation speed for a fourth duration.

In some embodiments, the target rotation speed is 3000 rpm.

In some embodiments, the fourth duration is 35 seconds.

In some embodiments, the first organic solvent is a Remover PG solvent, the first temperature is 80° C., and the first duration is 96 hours.

In some embodiments, the first organic solvent is an NMP solvent, the first temperature is 85° C., and the first duration is 4 hours.

In some embodiments, the metal overhead layer is an air bridge structure.

Optionally, the production line device further includes a control chip. The control chip may be respectively separately connected to a water bath immersion unit, a rinser, an ultrasonic cleaner, and a centrifuge to control the water bath immersion unit, the rinser, the ultrasonic cleaner, and the centrifuge for parameter adjustment, for example, to control a water bath temperature and duration of the water bath immersion unit, a rinsing duration of the rinser, an ultrasonic power and a cleaning duration of the ultrasonic cleaner, a rotation speed of the centrifuge, and the like.

Optionally, the production line device further includes a power supply, which is used to supply power to electrical devices such as the control chip, the water bath immersion unit, the rinser, the ultrasonic cleaner, and the centrifuge.

Optionally, the machines are spatially connected by a conveyor belt, or the target wafer is moved in space between the machines based on a robotic arm. Schematically, for example, a target wafer is moved in space between the machines based on a robotic arm. A photoresist is provided on a surface of the target wafer, and a surface of a photoresist layer of the photoresist is plated with a metal overhead layer. In a process of removing the photoresist on the target wafer once, first, parameters of the water bath immersion unit, the rinser, the ultrasonic cleaner, and the centrifuge are separately set through the control chip. Then the robotic arm is used to place the target wafer in the water bath immersion unit for a first duration, where the water bath immersion unit contains the first organic solvent at the first temperature. After the first duration is over, the robotic arm is controlled to move the target wafer to the rinser to cause the rinser to rinse the target wafer with a new first organic solvent. Then the robotic arm is used to move the target wafer to the ultrasonic cleaner containing the first organic solvent, and the ultrasonic cleaning is performed on the rinsed target wafer for the second duration based on the target ultrasonic power. After the second duration is over, the ultrasonic cleaner is used to remove the residual first organic solvent on the surface of the target wafer. Then the robotic arm is used to move the target wafer to the centrifuge to cause the centrifuge to dry the target wafer with the solvent removed. Finally, the target wafer with the photoresist removed and the metal overhead layer with the photoresist removed plated on the target wafer are obtained. For a treatment process performed by each machine on the target wafer in the above process, reference may be made to the related description in the embodiments shown in FIG. 2 or FIG. 3, and details are not repeated herein.

In an exemplary embodiment, a readable storage medium is further provided for storing at least one instruction, at least one program, a code set or an instruction set, and the at least one instruction, the at least one program, the code set or the instruction set are loaded and executed by the processor of the production line device to control corresponding devices to implement all or part of the steps in the photoresist removal method described above. For example, the computer-readable storage medium may be a read-only memory (ROM), a random access memory (RAM), a compact disc read-only memory (CD-ROM), a magnetic tape, a floppy disk, an optical data storage device, and the like.

Other embodiments of this application will be apparent to a person skilled in the art from consideration of the specification and practice of the disclosure here. This application is intended to cover any variations, uses or adaptive changes of this application. Such variations, uses or adaptive changes follow the general principles of this application, and include well-known knowledge and conventional technical means in the art that are not disclosed in this application. The specification and the embodiments are considered as merely exemplary, and the scope and spirit of this application are pointed out in the following claims.

It is to be understood that this application is not limited to the precise structures described above and shown in the accompanying drawings, and various modifications and changes can be made without departing from the scope of this application. The scope of this application is subject only to the appended claims.

What is claimed is:

1. A photoresist removal method, comprising:
   acquiring a target wafer, a photoresist being provided on a surface of the target wafer, a surface of a photoresist layer of the photoresist being plated with a metal overhead layer, the metal overhead layer comprising an air bridge structure;
   immersing the target wafer in a first container of first organic solvent for a first predefined duration, wherein the first container is placed in a water bath that has a first predefined temperature, the first predefined temperature and the first predefined duration are determined according to the first organic solvent;
   rinsing the target wafer with the first organic solvent in response to an end of the first predefined duration;
   placing the target wafer in a second container containing the first organic solvent at a second predefined temperature lower than the first predefined temperature, the target wafer having a target inclination angle against an interior side wall of the second container;
   suspending the second container containing the first organic solvent at the second predefined temperature on an ultrasonic cleaning water surface, wherein only a bottom surface of the second container contacts the ultrasonic cleaning water surface;
   performing ultrasonic cleaning on the target wafer placed in the second container that is suspended in the ultrasonic cleaning water surface for a second predefined duration based on a target ultrasonic power, the second predefined duration shorter than the first predefined duration;

removing residual first organic solvent on the surface of the target wafer in response to an end of the second predefined duration; and drying the target wafer to obtain the target wafer having the air bridge structure with the photoresist removed from top and bottom of the air bridge structure via simultaneous gas purging and centrifugal drying.

2. The method according to claim 1, wherein the target inclination angle is 45 degrees.

3. The method according to claim 1, wherein removing the residual first organic solvent on the surface of the target wafer in response to the end of the second predefined duration comprises:

placing the target wafer in a second organic solvent in response to the end of the second predefined duration; and performing ultrasonic cleaning on the target wafer for a third duration based on the target ultrasonic power to remove the residual first organic solvent on the surface of the target wafer.

4. The method according to claim 1, wherein drying the target wafer to obtain the target wafer comprises:

standing the target wafer on a paper surface to perform preliminary drying; and drying the target wafer via the simultaneous gas purging and centrifugal drying after the preliminary drying to obtain the target wafer having the air bridge structure with the photoresist removed from top and bottom of the air bridge structure.

5. The method according to claim 1, wherein the centrifugal drying is centrifugally rotating the target wafer at a target rotation speed for a fourth duration.

6. The method according to claim 5, wherein the target rotation speed is 3000 revolutions per minute (rpm).

7. The method according to claim 5, wherein the fourth duration is 35 seconds.

8. The method according to claim 1, wherein the first organic solvent is a Remover PG solvent, the first predefined temperature is 80° C., and the first predefined duration is 96 hours, the second predefined temperature is 22° C. and the second predefined duration is 5 minutes.

9. The method according to claim 1, wherein the first organic solvent is an N-methylpyrrolidone (NMP) solvent, the first predefined temperature is 85° C., and the first predefined duration is 4 hours, the second predefined temperature is 22° C. and the second predefined duration is 5 minutes.

10. The method according to claim 1, wherein the air bridge structure is a discrete air bridge.

11. The method according to claim 1, wherein the air bridge structure is an all-inclusive air bridge including a plurality of serially connected air bridges.

* * * * *